United States Patent
Lee et al.

(10) Patent No.: US 9,715,069 B2
(45) Date of Patent: Jul. 25, 2017

(54) PHOTO DIODE

(71) Applicant: ELECTRONICS AND TELECOMMUNICATIONS RESEARCH INSTITUTE, Daejeon (KR)

(72) Inventors: Eui Su Lee, Daejeon (KR); Won Hui Lee, Daejeon (KR); Kyung Hyun Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/143,148

(22) Filed: Apr. 29, 2016

(65) Prior Publication Data

US 2016/0320573 A1    Nov. 3, 2016

(30) Foreign Application Priority Data

Apr. 30, 2015  (KR) .......................... 10-2015-0061839

(51) Int. Cl.
*G02B 6/12* (2006.01)
*G02B 6/42* (2006.01)
(Continued)

(52) U.S. Cl.
CPC .......... *G02B 6/4201* (2013.01); *H01S 5/0262* (2013.01); *H01S 5/1007* (2013.01)

(58) Field of Classification Search
CPC .. H01S 5/1092; H01S 5/0262; H01S 2302/02; H01S 5/1003; H01S 5/1007; H01S 3/094096; G02B 6/29395
(Continued)

(56) References Cited

U.S. PATENT DOCUMENTS 5,134,671 A * 7/1992 Koren ................ G02B 6/12004
                                                385/1
6,282,219 B1 * 8/2001 Butler ................ G02B 6/12004
                                                372/102
(Continued)

FOREIGN PATENT DOCUMENTS

JP        11-307805 A      11/1999
KR   10-2003-0032129 A      4/2003
(Continued)

OTHER PUBLICATIONS

Ho-Jin Song et al., "Uni-Travelling-Carrier Photodiode Module Generating 300 GHz Power Greater Than 1 mW", IEEE Microwave and Wireless Components Letters, vol. 22, No. 7, pp. 363-365, Jul. 2012.
(Continued)

*Primary Examiner* — Ellen Kim
(74) *Attorney, Agent, or Firm* — Rabin & Berdo, P.C.

(57) ABSTRACT

Disclosed is a photo diode. The photo diode includes: at least two branched waveguides configured to receive beating signals; absorbing layers disposed in vertical directions to the waveguides, and disposed while being spaced apart from distal ends of the waveguides by a predetermined interval; and one or more intermediate layers formed based on the distal ends of the waveguides and disposed with the absorbing layers at upper end of the one or more intermediate layers.

5 Claims, 7 Drawing Sheets

(51) Int. Cl.
*H01S 5/026* (2006.01)
*H01S 5/10* (2006.01)

(58) Field of Classification Search
USPC ............... 385/2–32, 39–45, 49–50, 129–132
See application file for complete search history.

(56) References Cited

U.S. PATENT DOCUMENTS

| | | | | |
|---|---|---|---|---|
| 7,583,869 | B2* | 9/2009 | Kang | H01S 5/026 385/129 |
| 2003/0007719 | A1* | 1/2003 | Forrest | B82Y 20/00 385/14 |
| 2003/0067676 | A1* | 4/2003 | Wang | B82Y 20/00 359/344 |
| 2011/0149368 | A1* | 6/2011 | Kim | G02F 1/3534 359/276 |
| 2012/0147907 | A1* | 6/2012 | Kim | H01S 5/06258 372/4 |
| 2014/0175511 | A1 | 6/2014 | Sim et al. | |
| 2015/0102222 | A1* | 4/2015 | Kim | H01L 31/09 250/338.1 |
| 2015/0277208 | A1 | 10/2015 | Park et al. | |

FOREIGN PATENT DOCUMENTS

| | | |
|---|---|---|
| KR | 10-2010-0107360 A | 10/2010 |
| WO | WO-2014/046465 A1 | 3/2014 |

OTHER PUBLICATIONS

Atsushi Wakatsuki et al., "Development of Terahertz-wave Photomixer Module Using a Uni-traveling-carrier Photodiode", NTT Technical Review, vol. 10, No. 2, Feb. 2012.
E. S. Lee et al., "Design and Characterization of Evanescently-Coupled Photodiodes for 1.3 μm wavelength", IEEE, Sep. 14, 2014.
Kyung Hyun Park, "Terahertz Photonics", pp. 17-21, Oct. 2014.
ETRI Newsletter, vol. 63, Oct. 6, 2014.

* cited by examiner

PHOTO DIODE

CROSS-REFERENCE TO RELATED APPLICATION

This application claims priority to and the benefit of Korean Patent Application No. 10-2015-0061839, filed on Apr. 30, 2015, in the Korean Intellectual Property Office, the entire contents of which are incorporated herein by reference in their entirety.

BACKGROUND

1. Field

The present disclosure relates to a photo diode, which enables a broadband terahertz continuous wave to have a high output.

2. Description of the Related Art

In a generation of a terahertz (THz) continuous wave by using photo-mixing, a photo mixer serves to convert an incident beating signal into a terahertz continuous wave. Significant variables determining a characteristic of the photo mixer include a fast response rate, large dark-resistance, high carrier mobility, and the like.

Efficiency, a radiation pattern, and the like of the generated terahertz wave have a characteristic of being dependent on an integrated antenna, but in a case where the terahertz wave is applied to a broadband, an absorbing layer of the photo mixer needs to basically have the aforementioned characteristic.

The currently known photo mixer may be generally classified into two elements. One is an element using a low-temperature grown III-V semiconductor having a short carrier lifetime, and includes, for example, low-temperature grown indium-gallium-arsenic (InGaAs), gallium-arsenic (GaAS), indium-gallium-arsenic/indium-aluminum-arsenic (InGaAs/InAlAs) multi-layer, and erbium-arsenic/(indium) gallium-arsenic (ErAs/(In)GaAs). The other is an element using a photo diode structure having a short transit-time, and includes, for example, a unit-travelling carrier photo diode and a pin photo diode. When IR power of several tens of milliwatt (mW) is used in a level of about $10^{-3}$ of Terahertz/infrared (THz/IR) power conversion efficiency of the photo mixer using the photo diode structure, the photo mixer has a terahertz output of several tens of microwatt ($\mu$W). Compared to the photo mixer using the low-temperature grown III-V semiconductor, the photo mixer using the photo diode structure has a disadvantage in a band width aspect, but an output of the photo mixer using the photo diode structure in a low frequency band is considerably excellent, so that the photo mixer using the photo diode structure is advantageous to be applied to a system having up to about 1.5 THz.

A surface incident pin photo diode among the photo diodes has a characteristic in that responsivity is decreased when a rate of the photo diode is increased by using a thin absorbing layer. In contrast to this, a waveguide photo diode may improve photoelectric conversion efficiency while using a thin absorbing layer, but when light of large intensity is input, a response rate of the waveguide photo diode is decreased by a saturation effect. Due to the aforementioned problems, there is a problem in that it is difficult to satisfy both a broadband and a high output which are the conditions of the photo diode for the application of THz.

SUMMARY OF THE INVENTION

The present disclosure has been made in an effort to solve the above-described problems associated with the prior art, and provides a photo diode, which is capable of generating a broadband high output THz continuous wave in consideration of a limit of a single absorbing layer determining an operation characteristic.

An exemplary embodiment of the present disclosure provides a photo diode, including: at least two branched waveguides configured to receive beating signals; absorbing layers disposed in vertical directions to the waveguides, and disposed while being spaced apart from distal ends of the waveguides by a predetermined interval; and one or more intermediate layers formed based on the distal ends of the waveguides and disposed with the absorbing layers at upper end of the one or more intermediate layers.

The waveguides, the absorbing layers, and the intermediate layer may be disposed so that beating sources input through the waveguides physically have the same length until the beating sources reach the absorbing layers.

The photo diode may further include antennas disposed while being spaced apart from the absorbing layers at a predetermined interval.

The photo diode may further include a substrate, on which the waveguides, the absorbing layers, the antennas, and the one or more intermediates are integrated and disposed.

The one or more intermediate layers may have relatively larger refractivity than that of the waveguides.

According to the photo diode of the present invention, in order to overcome a low output due to a light absorbing saturation phenomenon by a single absorbing layer, a plurality of photo diodes having the same absorbing layer is arranged at the same phase, so that it is possible to generate broadband high output terahertz continuous waves.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE INVENTION

Hereinafter, exemplary embodiments according to the present disclosure will be described in detail with reference to the accompanying drawings. In the description below, it should be noted that only parts necessary for understanding operations according to various exemplary embodiments of the present disclosure will be described, and descriptions of other parts may be omitted so as to avoid unnecessarily obscuring the subject matter of the present disclosure.

The present disclosure provides a photo diode for generating a broadband high output terahertz continuous wave.

Figure 1:
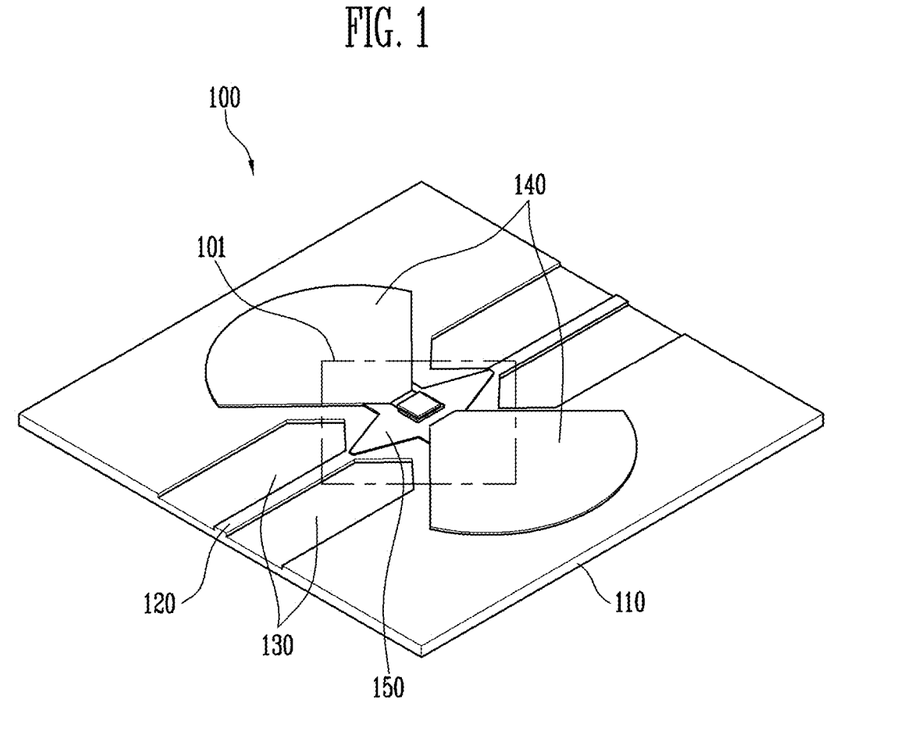
FIG. 1 is a diagram illustrating a photo diode according to an exemplary embodiment of the present disclosure.

FIG. 1 is a diagram illustrating a photo diode according to an exemplary embodiment of the present disclosure.

Referring to FIG. 1, a photo diode 100 includes a substrate 110, waveguides 120, waveguide forming recesses 130, antennas 140, and an intermediate layer (or an N-layer) 150. Further, the photo diode 100 includes an absorbing layer positioned on the intermediate layer, and a structure of the photo diode including the absorbing layer 101 will be described in detail with reference to FIG. 2 below.

The waveguides 120, the antennas 130, and the intermediate layer 150 are integrated on the substrate 110.

The waveguides 120 include, for example, a Y-distributor waveguide as a waveguide in a form of "Y". Here, two waveguides 120 are formed based on both side surfaces of the substrate 110, but for convenience of the description, the present disclosure will be described based on one waveguide 120.

The waveguide forming recesses 130 may be formed in both side surfaces of the waveguide 120 and may be recesses, in which the waveguides 120 are formed on the substrate 110.

The antenna 140 radiates electromagnetic waves. The antenna 140 may be implemented by one module or one or more modules. Here, two antenna modules formed in both side surfaces of the two waveguides 120 are illustrated.

The intermediate layer 150 is formed based on a branched point of a distal end of the waveguide 120, and has relatively higher refractivity than that of the waveguide 120. The intermediate layer 150 has a structure, which is gradually widened based on the branched point of the waveguide 120.

Figure 2:
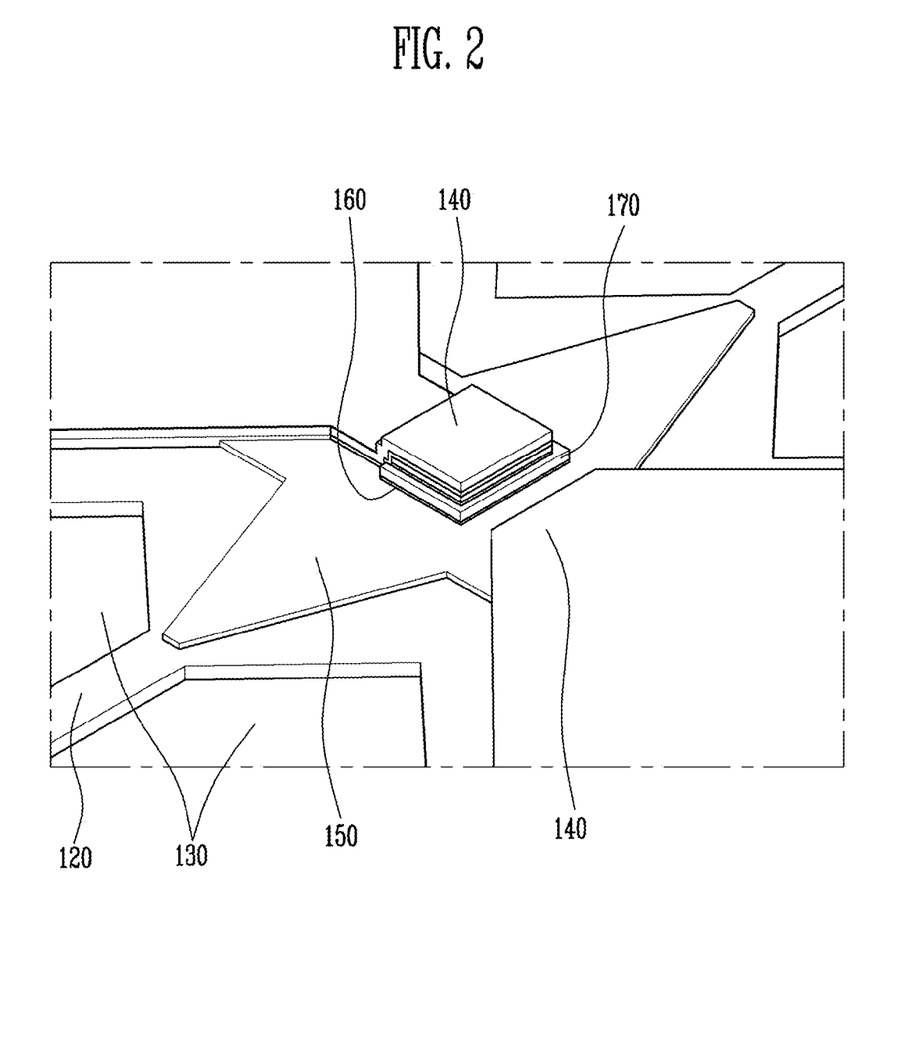
FIG. 2 is an enlarged diagram illustrating a part, in which an absorbing layer of the photo diode illustrated in FIG. 1 is positioned.

FIG. 2 is an enlarged diagram illustrating a part, in which an absorbing layer of the photo diode illustrated in FIG. 1 is positioned.

Referring to FIG. 2, a part 101, in which an absorbing layer 160 of the photo diode 100 is positioned, is enlarged. The waveguide 120 is formed on the substrate 110, and the intermediate layer 150 is formed at an upper end of a part, at which the waveguide 120 ends. In this case, the absorbing layer 160 is formed at an upper end of the intermediate layer, and the absorbing layer 160 is formed based on the branched point of the distal end of the waveguide 120.

The absorbing layer 160 is formed, and a P-layer 170 is formed at an upper end of the absorbing layer 160. One antenna 140 is connected to the upper end of the P-layer 170 to radiate electromagnetic waves. The other antenna 140 is disposed at the upper end of the intermediate layer 150, which is spaced apart from the absorbing layer 160 by a predetermined interval, to radiate electromagnetic waves.

Accordingly, the photo diode has a structure, in which the waveguides 120, the antennas 140, the intermediate layer 150, the absorbing layer 160, and the P-layer 170 are integrated on the substrate 110.

In this case, an area of the absorbing layer 160 is a significant factor for generating a broadband and high frequency terahertz continuous wave. The photo diode 100 has a value of a capacitor C, which is in proportional to the area of the absorbing layer 160, and a cutoff frequency ($f_{3dB}=1/(2\pi RC)$), which is in inverse-proportional to the area of the absorbing layer 160, is determined, so that the absorbing layer is designed so as not to have a large area.

Figure 3:
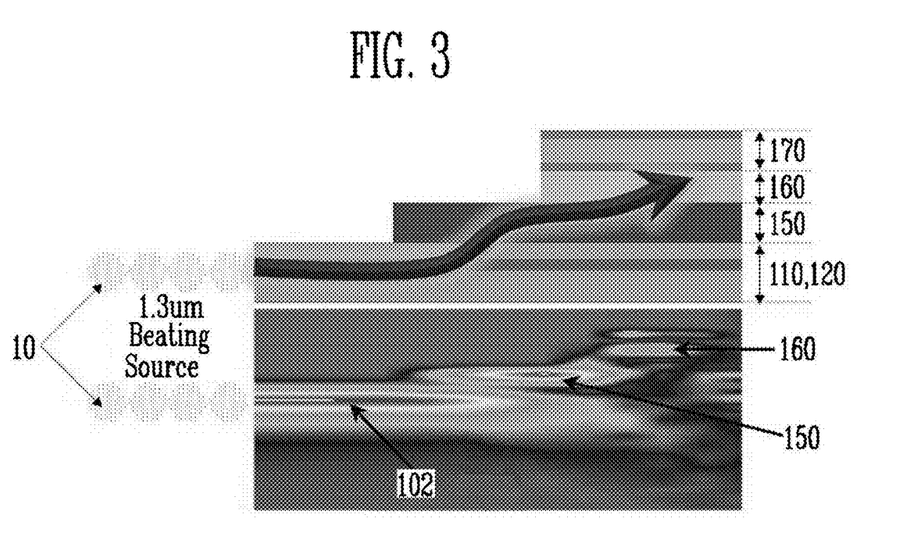
FIG. 3 is a diagram illustrating a cross-section of a region around the absorbing layer of FIG. 1.

FIG. 3 is a diagram illustrating a cross-section of a region around the absorbing layer of FIG. 1.

Referring to FIG. 3, the waveguide 120, the intermediate layer 150, the absorbing layer 160, and the P-layer 170 are sequentially disposed on a cross-section of the photo diode 100.

A beating source (or a beating signal (excitation light)) 10 may have a wavelength of about 1.3 λm. A transmission direction by the beating source is illustrated by an arrow. The beating source is coupled or inductively transmitted up to a region around the absorbing layer 160 through the waveguide 120 in a form of a shallow ridge, and has a structure, which is evanescently coupled in an up direction through the intermediate layer 140, which is positioned around an end region of the waveguide 120 and has relatively larger refractivity than that of the waveguide 120, and is considerably absorbable in the thin absorbing layer 160. The absorbed beating source has a structure in which the absorbed beating source is converted into a current, and then is radiated in a form of electromagnetic waves through the integrated antennas 140. A start point of the beating source is another end part of the waveguide 120, in which the intermediate layer 150 is not positioned.

A BPM simulation result is illustrated at a lower end of the cross-section of the photo diode 100, and coupling efficiency of 0.3 ampere/watt (A/W) can be seen. Accordingly, the waveguide 120, the intermediate layer 150, and the absorbing layer 160 consider an influence according to a structure variable therebetween.

Figure 5:
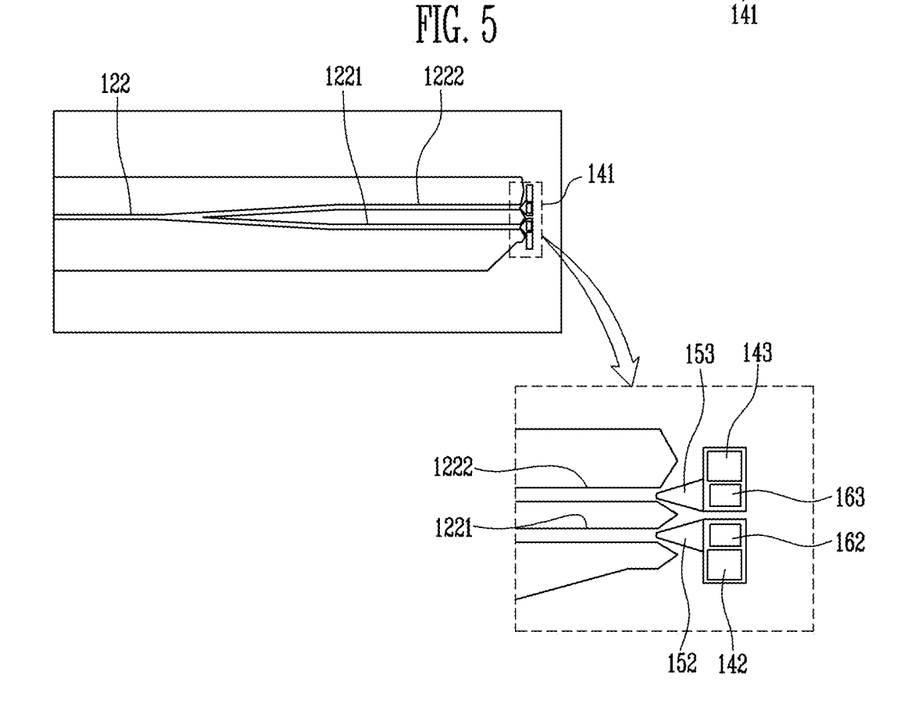
FIG. 5 is a diagram illustrating a structure of a photo diode including two absorbing layers according to an exemplary embodiment of the present disclosure.
Figure 6:
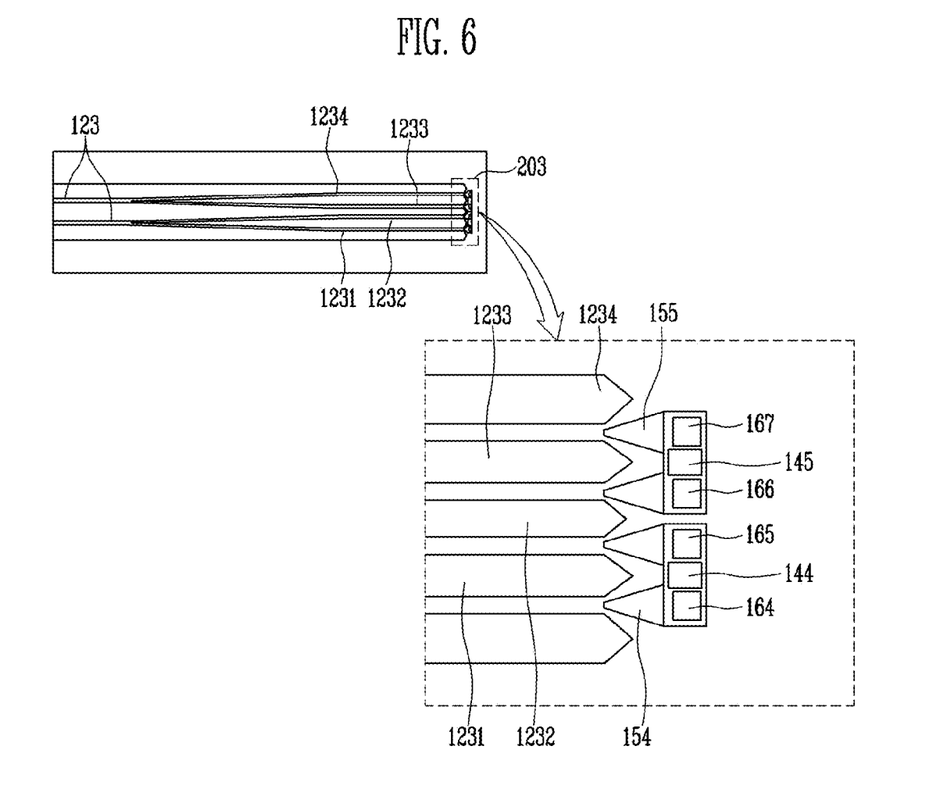
FIG. 6 is a diagram illustrating a structure of a photo diode including four absorbing layers according to an exemplary embodiment of the present disclosure.

As described above, in order to generate a broadband terahertz continuous wave, it is necessary to select the small area absorbing layer 160, and thus, a lower absorption saturation phenomenon is generated in the absorbing layer 160, compared to the beating source of a high input (30 mW or more (>30 mW)). For the generation of a high output, it is necessary to overcome a low absorption saturation phenomenon, and to this end, a plurality of absorbing layers having small areas may be included. A structure including one absorbing layer will be described with reference to FIG. 4 below, and the structures including the plurality of absorbing layers based on FIG. 4 are illustrated in FIGS. 5 and 6.

Hereinafter, for convenience of the description, a waveguide, an intermediate layer, an absorbing layer, and a distal end of an antenna in a photo diode will be described.

Figure 4:
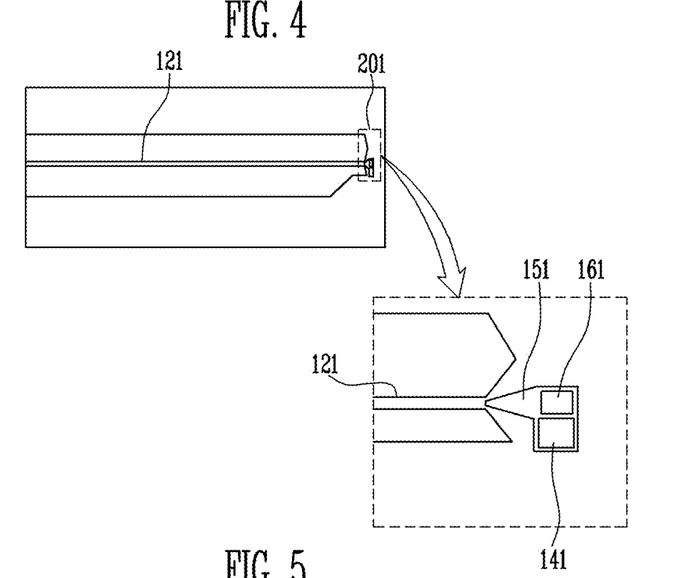
FIG. 4 is a diagram illustrating a structure of a photo diode including one absorbing layer according to an exemplary embodiment of the present disclosure.

FIG. 4 is a diagram illustrating a structure of a photo diode including one absorbing layer according to an exemplary embodiment of the present disclosure.

Referring to FIG. 4, one waveguide 121 is illustrated, and an absorbing layer 161 having a small area is positioned at a distal end of the waveguide.

A part 201, in which the absorbing layer 161 is disposed, is enlarged and illustrated at a right side. An intermediate layer 151 is formed based on the distal end of the waveguide 121, and the absorbing layer 161 is positioned at an upper end of the intermediate layer 151. An antenna 141 is connected to one side surface of the absorbing layer 161.

FIG. 5 is a diagram illustrating a structure of a photo diode including two absorbing layers according to an exemplary embodiment of the present disclosure.

Referring to FIG. 5, a waveguide 122 branched into two waveguides is illustrated, and absorbing layers 162 and 163 having small areas are positioned at distal parts of Y-shaped branched waveguides 1221 and 1222.

A part 202, in which the absorbing layers 162 and 163 are disposed, is enlarged and illustrated at a right side. Intermediate layers 152 and 153 are formed based on end parts of the waveguides 1221 and 1222. In this case, the absorbing layer 162 is positioned at an upper end of the intermediate layer 152, and an antenna 142 is connected to one side surface of the absorbing layer 162. The absorbing layer 163 is positioned at an upper end of the intermediate layer 153, and an antenna 413 is connected to one side surface of the absorbing layer 162. In this case, the absorbing layers 162 and 163 are adjacently disposed to each other, and the antennas 142 and 143 are disposed at a relatively longer distance compared to a distance between the absorbing layers 162 and 163.

FIG. 6 is a diagram illustrating a structure of the photo diode including four absorbing layers according to an exemplary embodiment of the present disclosure.

Referring to FIG. 6, a waveguide 123 branched into four waveguides is illustrated, and absorbing layers 164, 165, 166, and 167 having small areas are positioned at distal parts of Y-shaped branched waveguides 1231, 1232, 1233, and 1234.

A part 203, in which the absorbing layers 164, 165, 166, and 167 are disposed, is enlarged and illustrated at a right side. Intermediate layers 154 and 155 are formed based on end parts of the waveguides 1231, 1232, 1233, and 1234.

In this case, the intermediate layer 154 is formed to be connected to the waveguides 1231 and 1232, and the intermediate layer 155 is formed to be connected to the waveguides 1233 and 1234. Accordingly, one intermediate layer may be formed in a form sharing two waveguides.

The two absorbing layers 164 and 165 are positioned so as to correspond to the waveguides 1231 and 1232, respectively, at an upper end of the intermediate layer 154, and the two absorbing layers 166 and 167 are positioned so as to correspond to the waveguides 1233 and 1234, respectively, at an upper end of the intermediate layer 155.

An antenna 144 is connected between the two absorbing layers 164 and 165, and the other antenna 154 is connected between the other two absorbing layers 166 and 167.

In FIGS. 5 and 6, the waveguides are branched in the Y-form, and the waveguide is branched one time in FIG. 5, and the waveguide is branched two times in FIG. 6.

In the meantime, the absorbing layers 161 to 167 in FIGS. 4 to 6 may be disposed in a vertical direction to the waveguides 122, 1221, 1222, 1231, 1232, 1233, and 1234 in parallel, respectively.

Here, the plurality of waveguides may be arranged in a vertical direction based on one waveguide, and each of the waveguides may be disposed in parallel to the waveguide, which serves as a reference. Accordingly, the waveguide enables the first incident beating source to have the same physical length until the beating source reaches each absorbing layer. This is for the purpose that currents generated in other absorbing layers have the same phase.

FIGS. 4 and 5 are illustrated for convenience of the description, and the diode may be implemented in various forms, in addition to the aforementioned structures.

The present disclosure makes a current generated by the beating signal incident through a Y distributor have the same phase by disposing the single absorbing layer having a small area for a broadband operation side by side in a vertical direction to the waveguide of the beating signal. Accordingly, it is possible to overcome an output limit of the existing single photo diode.

Figure 7A:
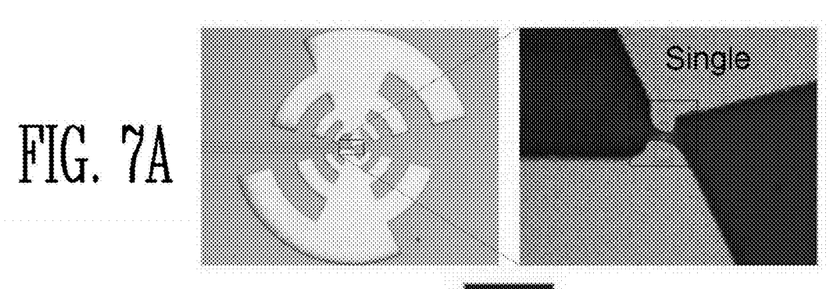
FIGS. 7A and 7B are diagrams illustrating photo diodes implemented by using a single waveguide and dual waveguides according to an exemplary embodiment of the present disclosure.
Figure 7B:
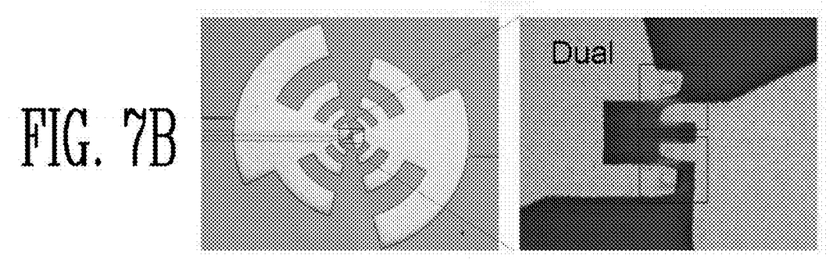

FIGS. 7A and 7B are diagrams illustrating photo diodes implemented by using a single waveguide and dual waveguides according to an exemplary embodiment of the present disclosure.

Referring to FIGS. 7A and 7B, FIG. 7A is an implementation example of a photo diode having a single waveguide and a single absorbing layer, and FIG. 7B is an implementation example of a photo diode having duel waveguides and two absorbing layers.

Figure 8:
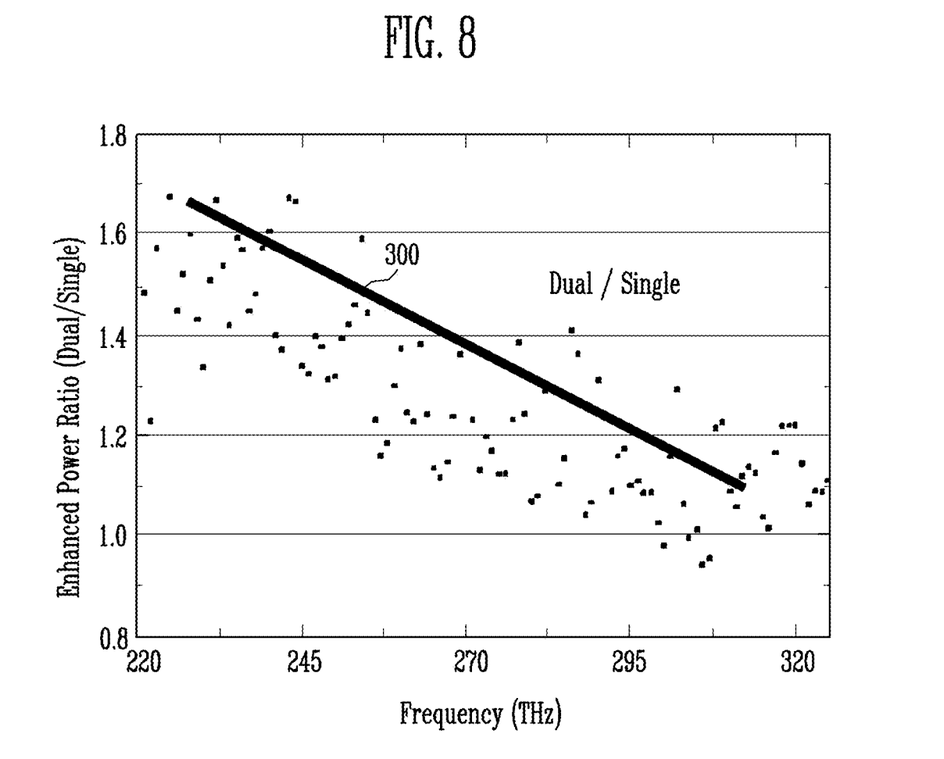
FIG. 8 is a graph illustrating a comparison of output power of a terahertz continuous wave according to FIGS. 7A and 7B.

FIG. 8 is a graph illustrating a comparison of output power of a terahertz continuous wave according to FIGS. 7A and 7B.

Referring to FIG. 8, a horizontal axis of the graph represents a frequency (THz), and a vertical axis of the graph represents a ratio of output power having dual waveguides and a single waveguide.

The graph illustrates a value obtained by dividing output power of the photo diode having the dual waveguides by output power of the photo diode having the single waveguide. Referring to a measurement result 300, it can be seen that performance is improved by about 1.7 times in a frequency band of about 220 THz.

The existing terahertz application systems have very low photoelectric conversion efficiency and low output, so that it is difficult to apply the terahertz application system to an existing industry or a new industry field. The present disclosure provides a high output and broadband terahertz continuous wave generator through the arrangement of the photo diode at the same phase, thereby being substantially applicable to the development of a terahertz application system. Further, the photo diode of the present disclosure may be expanded and applied to photo diodes having the similar structure.

In the detailed description of the present disclosure, the particular exemplary embodiment has been described, but various modifications are available without departing from the scope of the present disclosure. Therefore, the scope of the present disclosure is not limited to the exemplary embodiments described, but shall be defined by the claims to be described below and the equivalents to the claims.

What is claimed is:
1. A photo diode, comprising:
at least two branched waveguides configured to receive beating signals;
at least two absorbing layers respectively disposed on the at least two waveguides in a vertical direction, each absorbing layer being disposed apart from a distal end of the corresponding waveguide by a predetermined interval, the absorbing layers converting the beating signals into a terahertz continuous wave; and
at least one intermediate layer formed on the waveguides, wherein the intermediate layer is sandwiched between the waveguides and the absorbing layers.
2. The photo diode of claim 1, wherein the waveguides, the absorbing layers, and the intermediate layer are disposed so that beating sources input through the waveguides physically have the same length until the beating sources reach the absorbing layers.

3. The photo diode of claim 1, further comprising:
an antenna that receives currents of a same phase from the at least two absorption layers.

4. The photo diode of claim 3, further comprising:
a substrate, on which the waveguides, the absorbing layers, the antenna, and the at least one intermediate layer are integrated and disposed.

5. The photo diode of claim 1, wherein the at least one intermediate layer has larger refractivity than that of the waveguides.

* * * * *